United States Patent [19]

McIntosh

[11] Patent Number: 4,626,206
[45] Date of Patent: Dec. 2, 1986

[54] APPARATUS FOR INTEGRATED CIRCUIT ASSEMBLY OPERATIONS

[75] Inventor: Ricky A. McIntosh, Missouri City, Tex.

[73] Assignee: Texas Instruments Incorporated, Dallas, Tex.

[21] Appl. No.: 681,463

[22] Filed: Dec. 14, 1984

[51] Int. Cl.[4] .......................... F24J 3/00; F28F 7/00; H05B 1/00; F27D 11/00
[52] U.S. Cl. .................................. 432/230; 165/185; 219/210; 219/385; 219/388
[58] Field of Search ................ 432/230; 165/185, 120; 219/85 R, 85 D, 209, 210, 385, 388, 521

[56] References Cited

U.S. PATENT DOCUMENTS

| | | | |
|---|---|---|---|
| 1,919,950 | 7/1933 | Kerr | 219/434 |
| 3,566,514 | 3/1971 | Szumigala | 165/185 |
| 4,310,304 | 1/1982 | Decrulle | 432/230 |
| 4,374,316 | 2/1983 | Inamori et al. | 219/210 |

Primary Examiner—John J. Camby
Attorney, Agent, or Firm—Melvin Sharp; N. Rhys Merrett; John G. Graham

[57] ABSTRACT

An integrated circuit chip is alloyed to a ceramic header for a standard semiconductor package in an elongated preheater fixture. The fixture has a heating position laterally spaced from a loading position, with slots running from the loading to heating positions accommodating the pins of the header. The slots also function as fins to radiate heat so that a temperature gradient is created between loading and heating positions. As the headers slide from the loading position along the length of the fixture, the headers are heated to the bonded temperature without producing undue thermal stress.

5 Claims, 3 Drawing Figures

APPARATUS FOR INTEGRATED CIRCUIT ASSEMBLY OPERATIONS

BACKGROUND OF THE INVENTION

This invention relates to the manufacture of semiconductor devices, and more particularly to apparatus for alloying integrated circuit chips into standard packages.

In the manufacture of integrated circuit devices, silicon chips are bonded into semiconductor packages such as standard pin grid arrays or dual-in-line packages. This bonded is done at assembly stations where the chip and a ceramic header are heated to a temperature sufficiently high to fuse solder. The headers and the chips are both composed of materials that are subject to damage or cracking when subjected to high temperatures, especially when the change in temperature occurs rapidly. To avoid undue stress on the ceramic header it has been the practice to provide various fixtures for heating, alloying and cooling. However, these prior devices have been complex, required more operator time in manual operations, and yet produced excess thermal stress.

It is therefore the principal object of this invention to provide improved methods of manufacture of semiconductor devices, and more particularly to provide improved assembly operations that are more efficient yet prevent excess thermal stresses on parts that are subject to cracking or other damage. Another object is to provide an improved assembly fixture for an bonded operation in which an integrated circuit chip is fixed to a ceramic header or the like for a standard semiconductor package.

SUMMARY OF THE INVENTION

In accordance with one embodiment of the invention an integrated circuit chip is bonded to a ceramic header for a standard semiconductor package in an elongated preheater fixture. The fixture has a heating position laterally spaced from a loading position, with slots running from the loading to heating positions accommodating the pins of the header. The slots also function as fins to radiate heat so that a temperature gradient is created between loading and heating positions. As the headers slide from the loading position along the length of the fixture, the headers are heated to the bonded temperature without producing undue thermal stress.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
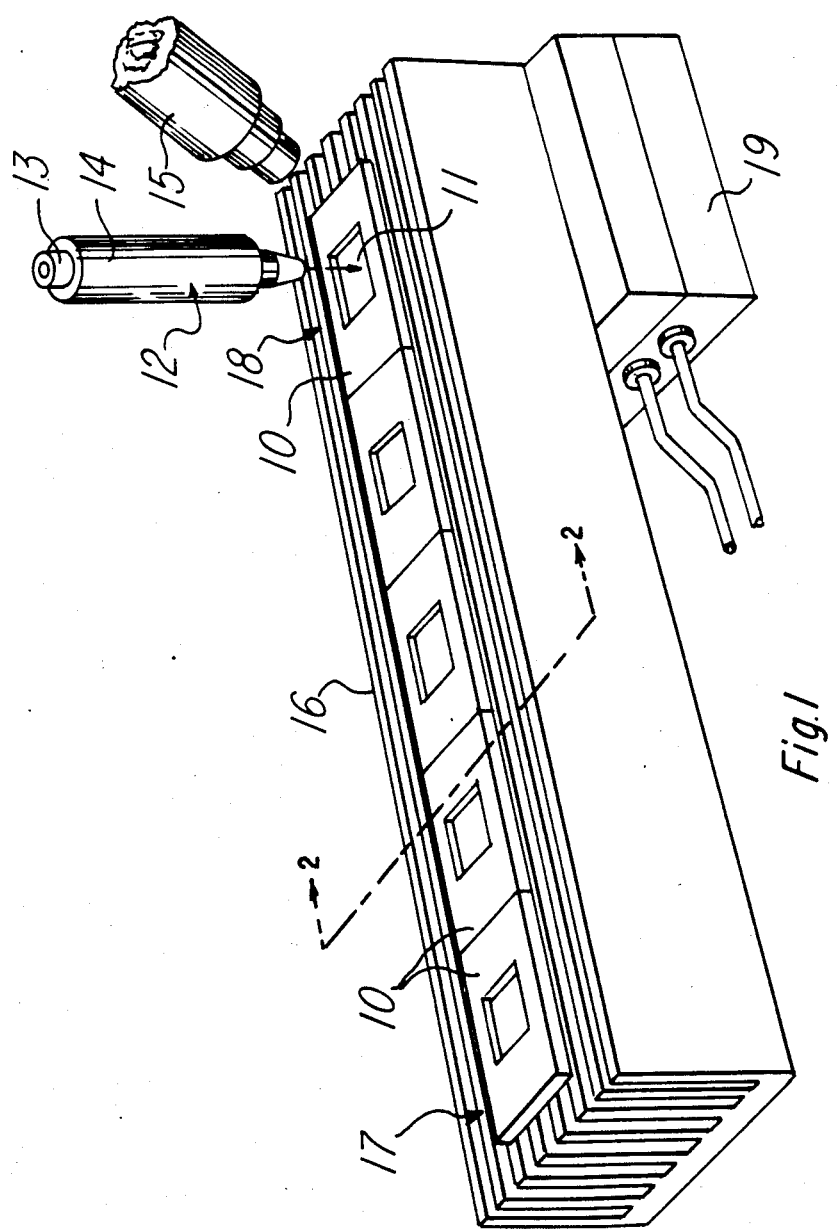
FIG. 1 is a pictorial view of an assembly workstation using the elongated one-piece bonded fixture of the invention.
Figure 3:
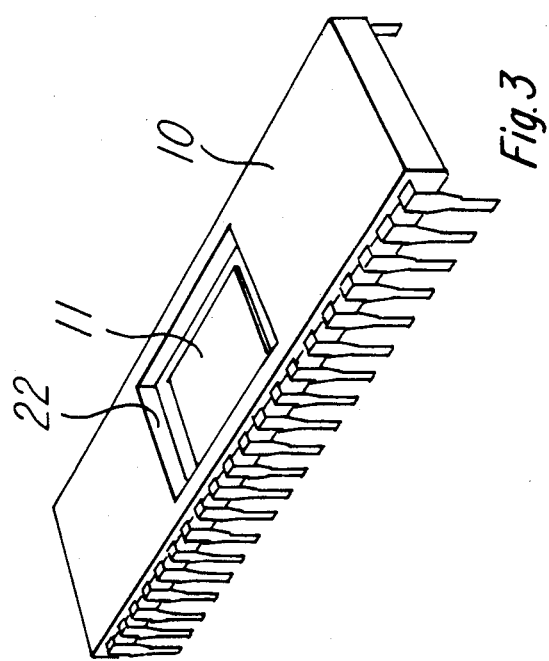
FIG. 3 is an enlarged pictorial view of a semiconductor package as assembled in the apparatus of FIG. 1.

Referring to FIG. 1, a workstation for a manufacturing facility for semiconductor devices is illustrated. The devices being manufactured are, for example, headers 10 for standard ceramic dual-in-line packages into which is bonded a semiconductor chip 11. Likewise, the packages could be pin grid arrays or other standard formats. The headers 10 are heated to a temperature, such as about 465 C., for example, to melt a solder preform and fasten the chip 11 (plated on its lower side with gold) to a gold-plated Kovar land at the bottom of a cavity in the header 10. The chip 11 is heated by a gas jet 12 consisting of a tube 13 through which nitrogen is forced, and an electric heater 14 surrounding the tube; this arrangement heats the nitrogen jet to about 470° C. A microscope 15 is positioned to allow the operator to view the work area to manually position the chip, using a vacuum handler or tweezers, for example. The chip is small, perhaps 150×150 mils.

According to the invention, the headers 10 are preheated by an elongated finned fixture 16 extending from the left side of the work area. This fixture 16 is composed of a heat conducting metal, stainless steel. The length is about 8-in. from a loading position 17 to the bonded area 18. It may extend beyond the work area to provide a cool-down area, but this is not always needed. An electric heater 19 is attached to the lower side of the fixture 16 to heat the work area 18 to the bonded temperature of 465° C., but the fins on the elongated area between the loading area 17 and the work area 18 cause the temperature to fall off markedly, so that the left edge of the fixture is hardly above room temperature. In this manner, headers 10 are placed on the loading area 17 by the operator (using tweezers, for example), one at a time, and pushed to the right. The time needed by the operator to perform the bonded operation when a package 10 reaches the work position 18 (including the manual operations of positioning the chip and solder, waiting for the nitrogen gas jet to heat the chip for the proper time, then removing the completed header from the fixture to the next position), is sufficient to properly ramp up the temperature of the header, i.e., properly preheat the header for the solder operation.

Figure 2:
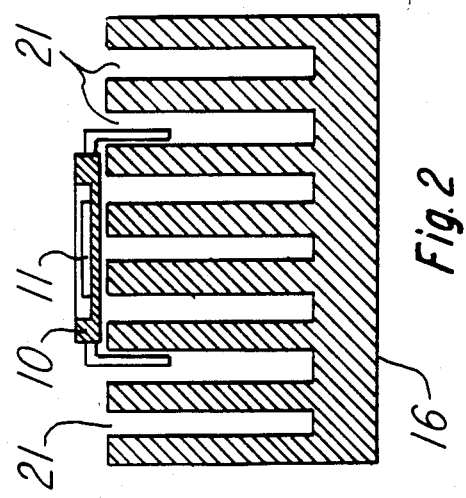
FIG. 2 is an elevation view in section of the fixture of FIG. 1, taken along the line 2—2 in FIG. 1.

The spacing between the slots 21 in the fixture 16, as seen in the section view of FIG. 2, is selected to accommodate the lead spacing of standard DIP (dual-in-line) or pin grid array and other packages commonly used. The pin spacing of the largest standard packages fit over the outside of the fixture 16, i.e., not in the slots 21.

After the bonded operation the assembly is completed by bonding gold wires from bonding pads on the chip 11 to tabs within the cavity 22 of the header at a bonding station, then soldering a metal lid over the cavity. It is understood that the fixture 16 of the invention may be used in other operations, such as this bonding equipment, and may be adapted for automatic rather than manual operation.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. Apparatus for performing a manufacturing operation on a plurality of workpieces in sequence, comprising:

an elongated heat-conducting fixture having a heater engaging the fixture at a work position, the work position being laterally spaced from one end of the fixture by a transit distance selected for preheating said workpieces, a loading position at said one end for initially loading said workpieces into said fixture, a plurality of slots extending into said fixture a substantial part of the thickness thereof and extending along said fixture from said loading position to said work position to radiate heat and define a temperature gradient along the length of the fixture to thereby preheat the workpieces, the slots being spaced from one another along the width of the fixture to receive pins depending from the workpiece for a pluarlity of standard spacings of such pins.

2. Apparatus according to claim 1, wherein said fixture is of stainless steel.

3. Apparatus according to claim 1, wherein said fixture has a length, depth and slot spacing and depth so as to establish a temperature gradient suitable for preheating ceramic headers for semiconductor packages.

4. Apparatus according to claim 3 wherein the length of said elongated fixture from said loading position to said work position is at least about five times the length of one of said headers.

5. Apparatus according to claim 4 wherein said fixture is heated to greater than 400 C. at said work position, and said fixture radiates heat due to said slots whereby said one end is not over about 100 C.

* * * * *